United States Patent
Martin et al.

(10) Patent No.: US 6,258,287 B1
(45) Date of Patent: *Jul. 10, 2001

(54) METHOD AND APPARATUS FOR LOW ENERGY ELECTRON ENHANCED ETCHING OF SUBSTRATES IN AN AC OR DC PLASMA ENVIRONMENT

(75) Inventors: Kevin P. Martin, Atlanta, GA (US); Harry P. Gillis, Los Angeles; Dmitri A. Choutov, Santa Clara, both of CA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/932,025

(22) Filed: Sep. 17, 1997

Related U.S. Application Data

(63) Continuation-in-part of application No. 08/705,902, filed on Aug. 28, 1996, now Pat. No. 5,882,538.
(60) Provisional application No. 60/026,985, filed on Sep. 20, 1996, and provisional application No. 60/026,587, filed on Sep. 20, 1996.

(51) Int. Cl.⁷ .................................................. C03C 15/00
(52) U.S. Cl. ........................... 216/71; 438/731; 156/345
(58) Field of Search .................... 156/345; 204/298.31, 204/298.34; 216/71, 67; 118/723 E, 723 R; 438/729, 730, 731, 906; 134/1.1, 1.2, 19, 21, 25.1

(56) References Cited

U.S. PATENT DOCUMENTS

| | | | |
|---|---|---|---|
| 4,259,145 | 3/1981 | Harper et al. | 156/643 |
| 4,309,267 | 1/1982 | Boyd et al. | 204/298 |
| 4,450,787 | 5/1984 | Weakliem et al. | 118/723 |
| 4,496,881 | 1/1985 | Cheever | 315/357 |
| 4,609,428 * | 9/1986 | Fujimura | 4/192.32 |
| 4,871,580 * | 10/1989 | Schram et al. | 427/562 |
| 4,874,459 | 10/1989 | Coldren et al. | 156/643 |
| 5,003,178 | 3/1991 | Livesay | 250/492.3 |
| 5,039,376 | 8/1991 | Zukotynski et al. | 156/643 |
| 5,138,169 | 8/1992 | Yamazaki et al. | 250/398 |
| 5,368,676 | 11/1994 | Nagaseki et al. | 156/345 |
| 5,453,305 | 9/1995 | Lee | 427/562 |
| 5,457,298 | 10/1995 | Nelson et al. | 219/121.52 |
| 5,556,501 * | 9/1996 | Collins et al. | 156/345 |
| 5,660,744 | 8/1997 | Sekine et al. | 219/121.43 |
| 5,882,538 * | 3/1999 | Martin et al. | 216/71 |

OTHER PUBLICATIONS

S. Veprek et al., "The Preparation Of Thin Layers Of Ge And Si By Chemical Hydrogen Plasma Transport," Solid–State Electronics Pergamon Press 1968, vol. 11, pp. 683–684.

S. Veprek et al., "Parameters Controlling The Deposition Of Amorphous And Microcrystalline Silicon In Si/H Discharge Plasmas," Journal De Physique (Paris) 42, C4–251 (1981).

S. Veprek, "Highlights Of Preparative Solid State Chemistry In Low Pressure Plasmas," Pure & Appl. Chem., vol. 54, No. 6, pp. 1197–1220, 1982.

(List continued on next page.)

*Primary Examiner*—Randy Gulakowski
*Assistant Examiner*—Allan Olsen
(74) *Attorney, Agent, or Firm*—Thomas, Kayden, Horstemeyer & Risley, L.L.P.

(57) ABSTRACT

A method of low-damage, anisotropic etching of substrates including mounting the substrate upon a mechanical support located within an ac or dc plasma reactor. The mechanical support is independent of the plasma reactor generating apparatus and capable of being electrically biased. The substrate is subjected to a plasma of low-energy electrons and a species reactive with the substrate. An additional structure capable of being electrically biased can be placed within the plasma to control further the extraction or retardation of particles from the plasma.

18 Claims, 6 Drawing Sheets

OTHER PUBLICATIONS

H.P. Gillis et al., "Low Energy Electron–Enhanced Etching Of Si(100) In Hydrogen/Helium Direct–Current Plasma," Appl. Phys. Lett. 66 (19), May 8, 1995.

H.P. Gillis et al., Low Energy Electron–Enhanced Etching Of GaAs(100) In a Chlorine/Hydrogen DC Plasma, Appl. Phys. Lett. 68 (16), Apr. 15, 1996.

H.P. Gillis et al., "Low Energy Electron–Enhanced Etching Of GaN/Si in Hydrogen Direct Current Plasma," J. Electrochem Soc., vol.143, No. 11, Nov. 1996.

H.P. Gillis et al., "The Dry Etching Of Group III–Nitride Wide–Bandgap Semiconductors," Journal of Materials, 48, 50–55 (1996).

E. Wiberg et al., "Hydrides of the Elements of Main Groups I–IV," New York, 1971, Chapter 6, pp. 443–460.

P. Breisacher et al., "Comparative Stabilities Of Gaseous Alane, Gallane, And Indane," Journal of the American Chemical Society, pp. 4255–4258, 87:19, Oct. 5, 1965.

K. Choquette et al., "Hydrogen Plasma Processing Of GaAs And AlGaAs," J. Vac. Sci. Technol. B, vol. 11, No. 6, Nov./Dec. 1993, pp. 2025–2032.

J.R. Creighton, "Hydrogen Chemisorption And Reaction On GaAs(100)," J. Vac. Sci. Technol. A 8 (6), Nov./Dec. 1990, pp. 3984–3987.

S. Veprek et al., "Electron–Impact–Induced Anisotropic Etching of Silicon By Hydrogen," Plasma Chemistry and Plasma Processing, vol. 2, No. 3, 1982.

A.P. Webb, "Reactivity Of Solid Silicon With Hydrogen Under Conditions Of A Low Pressure Plasma," Chemical Physics Letters, vol. 62, No. 1, Mar. 15, 1979, pp. 173–177.

H.P. Gillis et al., "Low–Energy Electron Beam Enhanced Etching Of Si(100)–(2×1) By Molecular Hydrogen," J. Vac. Scl. Technol. B, vol. 10, No. 6, Nov./Dec. 1992.

* cited by examiner

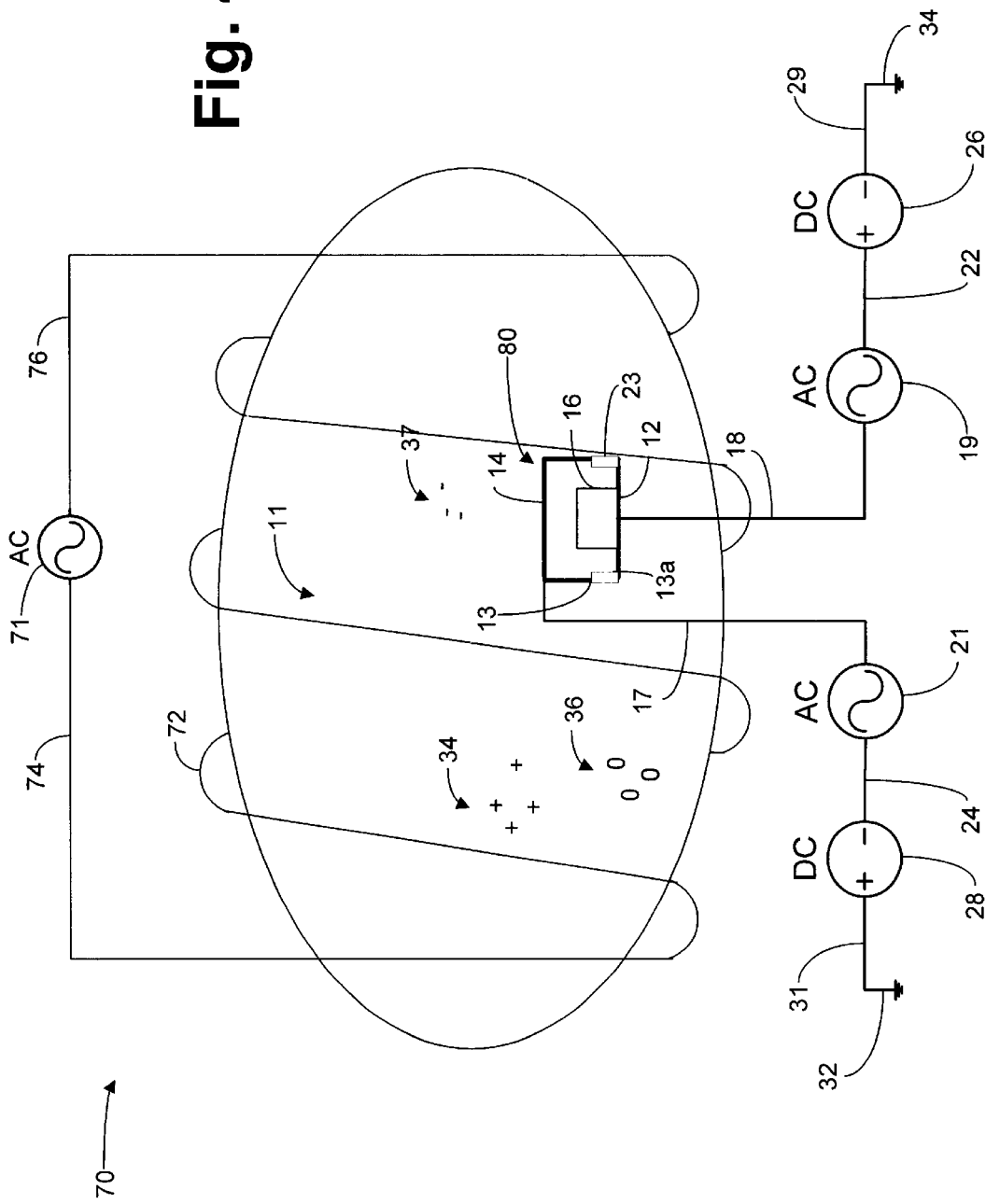

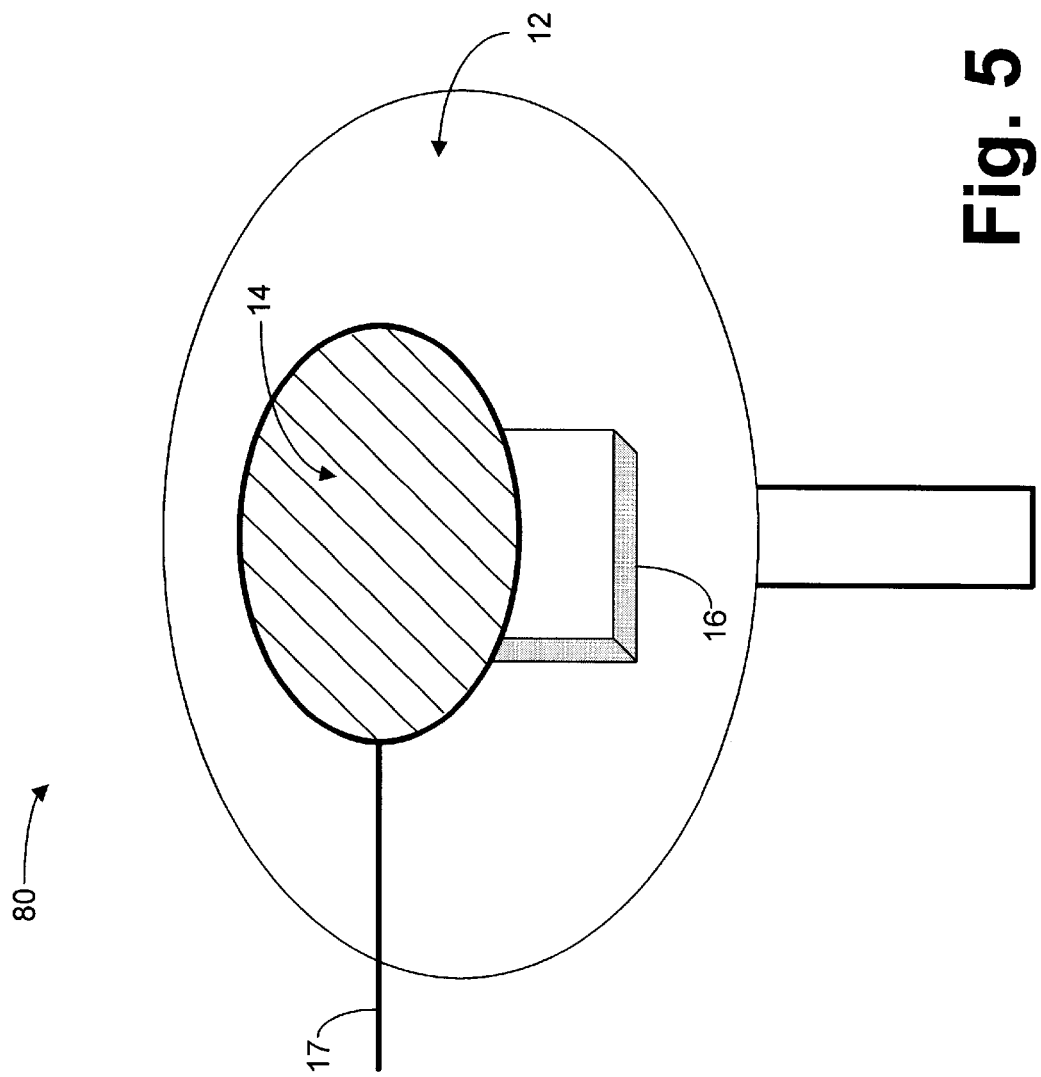

METHOD AND APPARATUS FOR LOW ENERGY ELECTRON ENHANCED ETCHING OF SUBSTRATES IN AN AC OR DC PLASMA ENVIRONMENT

RELATED APPLICATIONS

This document claims priority to and the benefit of the filing date of Provisional patent application Ser. Nos. 60/026,985, filed Sep. 20, 1996, entitled "APPARATUS AND PROCESS FOR LOW-DAMAGE DRY ETCHING OF INSULATORS BY LOW ENERGY ELECTRON ENHANCED ETCHING IN A DC PLASMA"; 60/026,587, filed Sep. 20, 1996, entitled "APPARATUS AND PROCESS FOR LOW-DAMAGE DRY ETCHING OF INSULATORS BY LOW ENERGY ELECTRON ENHANCED ETCHING IN AN AC PLASMA"; and a C-I-P of U.S. patent application Ser. No. 08/705,902, filed on Aug. 28, 1996 now U.S. Pat. No. 5,882,538 entitled "METHOD AND APPARATUS FOR LOW ENERGY ELECTRON ENHANCED ETCHING OF SUBSTRATES".

FIELD OF THE INVENTION

The present invention relates generally to the preparation of etched substrates. More particularly, the present invention relates to an improved process for low-damage, anisotropic etching of substrates such as semiconductors and insulators, and improved anisotropically etched substrates.

BACKGROUND OF THE INVENTION

Dry etching is an absolutely critical process in the fabrication of all micrometer and nanometer scale features on high speed electronic and opto-electronic devices. In brief, the fabrication of such chips and devices involves the following process. A substrate of some semiconductor or metal is selected and a pattern is laid down over it, the pattern having open areas in it. The overlying structure containing the pattern is sometimes called a mask. Etching chemistry is then performed through the open areas, which means that in effect some of the underlying material exposed through the open areas is dissolved away so that the pattern is transferred into the underlying layer(s). Then, the mask is stripped away and what is left behind is the original substrate, but now the pattern has been transferred into it. The process is similar to silk screening or stamping a pattern into material. The resulting pattern has a three dimensional structure.

In the early days of integrated circuit fabrication, most etching was done using a wet chemical process that is quite similar to conventional photography. For example, to etch an array of grooves in a silicon wafer, the wafer is first placed in a high temperature, oxidizing environment and a layer of silicon dioxide is grown on the top surface of the wafer. Then, the oxidized wafer is covered with a thin photosensitive layer of gelatinous organic material called a "photoresist." Next, a piece of material analogous to a photographic negative, called a "photomask," is placed over the photoresist. Ultraviolet light is shined through openings in this photomask. The ultraviolet light changes the solubility of the photoresist. Thus, areas of photoresist that have been illuminated with the ultraviolet light display a different solubility than areas which have not been exposed to the light. Finally, a solvent is used which dissolves away only the areas of the photoresist which have had their solubility increased by the ultraviolet light. At this point, the original pattern on the photomask has been transferred to the photoresist layer. Some people refer to this patterned photoresist layer as a "soft mask."

Subsequently, a wet chemical, hydrofluoric acid (HF) dip is used to dissolve away the silicon dioxide which has been exposed through each of the openings in the overlaying photoresist. Then, the photoresist is stripped off. At this point, it is apparent that the pattern originally appearing on the photomask has been transferred to the silicon dioxide layer overlying the silicon wafer. This patterned layer of silicon dioxide is sometimes referred to as a "hard mask."

Finally, the wafer is dipped into a caustic etch, such as potassium hydroxide (KOH) which etches away the silicon exposed under the openings in the hard mask. After stripping away the hard mask, the desired silicon wafer with the etched grooves remains.

As an alternative to following the hard masking step described above with a KOH silicon etch, ion implantation or high temperature diffusion could optionally be used to place dopant atoms through the openings in the hard mask.

Many other structural and chemical variations using the sorts of wet processing steps described above are possible and are well known to those of skill in the art. In each case however, the corresponding process suffers from a problem that is inherent with the associated etching using wet chemicals. In particular, at the same time that the wet chemistry is etching down into the wafer, it is also etching laterally under the mask. Indeed, this undesired lateral etching tends to extend approximately as far as the desired vertical etching. This tendency for wet chemical etching to proceed equally in all directions without prejudice is called "isotropic etching."

Isotropic etching is adequate for making a line that is 20 microns wide through a film that is 1 micron deep. The resulting inaccuracy in the edges of such a feature is a small percentage of the overall device structure; and therefore, it does not compromise performance. However, as smaller and smaller structures are fabricated, isotropic etching is inadequate. The industry is moving toward fabrication of structures with so called sub-micron features, which are essential for high speed computer chips, optical structures, and electronic and optoelectronic devices. In other words, the accurate transfer of a pattern which is half a micron wide into a material which is half a micron thick requires absolutely straight vertical side walls, or anisotropic etching. Isotropic etching is inadequate because the associated rounded undercut would be a very high percentage of the active device material and would destroy its performance.

Presently, it is thought that the only way to get straight side walls is by a technique called reactive-ion etching (RIE). Rather than dipping the device in wet chemicals, it is exposed to reactive gases in plasmas. Energetic ions formed in the plasma are accelerated in the normal direction to the substrate where they enhance the etching chemistry at the bottom of the open area defined by the mask and not on the sidewalls. Thus, straight side walls can be achieved with reactive-ion etching.

Reactive-ion etching provides anisotropic etching. However, the ions are heavy ions like argon or $CF_3^+$ and are traveling at a few hundred electron volts of kinetic energy. Thus, they carry enough momentum to displace lattice atoms from their normal position. This damages the surfaces and often, the optical and electrical properties of the substrate have been detrimentally changed.

Fabrication of ultra small electronic and optoelectronic devices requires dry etching processes that give high anisotropy, high selectivity between different materials, and minimal surface damage. Currently, ion enhanced plasma etching processes (e.g. reactive ion etching (RIE) and electron cyclotron enhanced RIE (ECR)) create high aspect ratio nanometer scale features; however, etch induced damage has become increasingly troublesome as critical dimensions shrink. To minimize etch damage, reactive species generated in the plasma should have energies larger than the activation energy of the etch reaction (a fraction of an eV), but less than the energy required for atomic displacement (3 to 10 eV for III–V semiconductors). Given these limitations, the ion energies available in reactive-ion (about 300 eV) and electron cyclotron resonance plasma etching (about 50 eV) are not ideally suited for fabricating nanometer scale devices.

Placing the sample to be etched on the anode within a DC plasma environment is one way to ensure precise control over the anisotropic etching process while minimizing damage to the substrate and is described in commonly assigned copending U.S. patent application Ser. No. 08/705,902, filed Aug. 28, 1996 and titled "METHOD AND APPARATUS FOR LOW ENERGY ELECTRON ENHANCED ETCHING OF SUBSTRATES". This technique is called Low Energy Electron Enhanced Etching (LE4, for convenience), and operates by placing the etching substrate on the anode of a DC glow discharge. This method works well for conducting and semi-conducting substrates, but is inherently problematic for etching non-conducting substrates such as insulators because, in the aforementioned method, the substrate sample is physically and electrically connected to the anode in the plasma, thus becoming a conducting element of the electrical circuit within the plasma. An insulator, by definition does not efficiently conduct electrical current. Therefore, placing an insulating substrate on the anode will impede the electrical flow and will be an inefficient and nearly impossible way to etch a non conducting substrate.

What is needed and was apparently not available until the presently described invention, is a method of etching that eliminates the damage inflicted by reactive-ion etching, achieves anisotropic etching, and is indeed applicable to all forms of substrates, including insulating substrates. Furthermore, it is desirable to have additional control over the etching process. Specifically, it is desirable to have the ability to control more precisely the flux, or rate per unit area of particles being imparted to the sample, and the energy that the particles impart.

A method of electron-impact-induced anisotropic etching of silicon (Si) by hydrogen is discussed in a 1982 article by S. Veprek and F.-A. Sarott, "Electron-Impact-Induced Anisotropic Etching of Silicon by Hydrogen", Plasma Chemistry and Plasma Processing, Vol. 2, No. 3, p. 233. The authors discuss successful etch rates of up to 1,000 Å/min with little surface roughness at low temperatures. At higher temperatures a rougher pattern was seen. While their exact methodology is unclear, the authors apparently used an apparatus described in a previous publication by A. P. Webb and S. Veprek, "Reactivity of Solid Silicon With Hydrogen Under Conditions of a Low Pressure Plasma", Chemical Physics Letters, Vol. 62, No. 1, p. 173 (1978). That publication describes an apparatus including a DC glow discharge device with the sample immersed in the positive column. The cathode was a standard hot cathode (heated to between 1500–2000 K) having a tungsten filament coated with thorium oxide. While this technique apparently worked for etching Si(111) with hydrogen, it would not work using other reactive gases such as oxygen, chlorine, and fluorine because the hot filament would be immediately consumed. Furthermore, the apparatus described by Veprek and Sarott is cumbersome.

Other experiments, reported by Gillis et al. in an article entitled "Low-Energy Electron Beam Enhanced Etching of Si(100)—(2×1) by Molecular Hydrogen," J. Vac. Sci. Technology B 10(6), November/December, p. 2729 (1992), focused on flooding Si with low energy electrons (200–1000 eV) produced by an electron gun. The authors reported etching at a rate of about 100 Å/min with low damage to the Si surface. Other papers by the present inventors are: "Low Energy Electron—Enhanced Etching of Si(100) in Hydrogen/Helium Direct—Current Plasma", (Gillis et al., Appl. Phys. Lett., Vol 66(19), p. 2475 (1995)); "Low Energy Electron—Enhanced Etching of GaAs(100) in a Chlorine/Hydrogen DC Plasma" (Gillis et al., Appl. Phys. Lett., Vol. 68(16), p. 2255 (1996)); "Low Energy Electron-Enhanced Etching of GaN in a Hydrogen DC Plasma" J. Electrochem. Soc., 143, L251 (1996); and "Highly Anisotropic, Ultrasmooth Patterning of GaN/SuiC by Low Energy Electron Enhanced Etching in a DC Plasma" (Gillis et al., J. Electr. Mat. 26, 301–305 (1997)). These publications are incorporated herein by reference, in their entireties.

H. Watanabe and S. Matsui, writing in Applied Physics Letters, Volume 61, 1992, pp. 3011–3013, describe a related approach to achieve a process they call Electron Beam (EB)-assisted dry etching. They use porous grids to extract a "shower" of electrons from an ECR plasma and direct it toward a substrate. However, they operate the ECR source on argon gas, and then insert a separate gas ring nozzle between extraction grids and substrate. This gas ring, resembling somewhat an ordinary gas burner on a kitchen range, distributes the reactive gas (chlorine, in their case) over the etching substrate. They apply only a DC bias to the substrate, to increase electron collection efficiency and energy. They report results only for semiconductor substrates, not insulators.

SUMMARY OF THE INVENTION

The present invention involves low energy electron enhanced etching (LE4), as opposed to reactive ion enhanced etching, and comprises an improvement thereupon by permitting the effective anisotropic etching of all substrates including conducting, semi-conducting and insulating substrates. The process and apparatus give straight side walls, and it does not damage the substrate. In contrast to the above-described reactive ions, the low energy electrons that are used in the present invention travel at less than about 100 electron volts (eV) kinetic energy (KE), preferably at less than about 20 eV. The mass of electrons is many orders of magnitude smaller than the mass of ions and the electrons carry essentially no momentum to the surface. Therefore, they do not damage the surface.

Furthermore, the present invention allows significantly enhanced control over the etching process by permitting variations in the flux, or rate, of electrons and neutral specie particles imparted to a sample substrate and the energy of arrival of those particles imparted to a sample substrate. This is done by establishing a local electrical field in the vicinity of the sample with respect to the plasma, thus any charged specie of particle that feels that potential will respond enabling the extraction or retardation of particles from the plasma. Because this is done in the vicinity of the sample, the present invention allows precise control over the flux and energy parameters of the particles arriving at the sample.

The present invention provides a low damage alternative to ion enhanced processes, using low energy electron enhanced etching (LE4), in which the substrate is supported on a structural member within the plasma field, and in an alternative embodiment, a conducting substrate is supported by an anode of a dc plasma reactor. In all but the embodiment having the sample supported by the anode of a dc plasma reactor, the plasma field may be a DC plasma or an AC plasma.

The energy of electrons and negative ions arriving at the substrate on the anode of a DC discharge is limited to a value not greater than the ionization potential of the reaction gas; energies above this limit are effectively dissipated by inelastic collisions in the gas phase. No such fundamental limit is imposed on the positive ions produced in RF and microwave plasmas. For dc plasma reactors a voltage of about 0.5–2 kV is applied between the cathode and the anode, generating a glow discharge in which electrons having a kinetic energy of less than about 100 eV, or, preferably less than about 20 eV arrive at the anode.

In one aspect, the invention involves a process for low-damage, anisotropic etching of a substrate that includes the steps of placing the substrate on a mechanical structure designed to support the sample to be etched within a plasma reactor and subjecting the substrate to a plasma including low energy electrons and a gaseous species that is reactive with the substrate. The substrate can be a Group IV semiconductor, a Group III–V semiconductor, a Group II–VI semiconductor, an oxide, a nitride, a metal, an alloy or mixture of the foregoing, or an insulating substrate. The reactive species can be any that reacts with the substrate and that volatilizes within the temperature and flow of the device. Typical reactive species to be used are hydrogen, halogens, interhalogen compounds, hydrogen halides, and volatile organic compounds. The concepts of the present invention are equally applicable to an ac plasma or a dc plasma. Three embodiments of the present invention will be discussed.

It is important to note that in the case of a plasma reactor that uses electrical conductors such as an anode and a cathode to generate the plasma flow, in all but one variation, the mechanical support is not used as an electrode to generate or maintain the plasma flow, but in a first preferred embodiment, merely as a mechanical support for the sample to be etched, and in subsequent embodiments, not as an electrode involved in the generation or maintenance of the plasma, but one which both mechanically supports the sample and also imparts an electrical bias to the sample resting thereon.

In a first preferred embodiment in which no external voltage is applied to the mechanical support, and thus the sample, the sample achieves a "floating potential," which in the case of a dc plasma, is negative relative to the "plasma potential" in the body of the plasma.

In a second preferred embodiment, and with respect to a dc plasma reactor, an external electrical bias, with respect to the plasma potential, is applied to the mechanical support, and therefore to the sample. The external electrical bias applied to the mechanical support can be of a dc or an ac nature, or a combination of the two. To prevent buildup of a negative potential which can eventually stop the etching process, the sample must be periodically "discharged" or "neutralized" by reducing the external bias slightly below plasma potential. This will enable a sufficient number of positive ions to arrive from the plasma to cancel the accumulated negative charge, while keeping their energy too small to inflict ion bombardment damage. Thus, the substrate on the mechanical support must be subjected to a modulated positive voltage.

In a third preferred embodiment an additional structure, for example a grid, or a permeable cap, capable of imparting an electrical potential is placed within the plasma. This additional structure is one that is capable of being electrically biased in similar fashion to that of the mechanical support used to support the sample. This additional structure is typically placed within the plasma in close proximity to the sample to be etched. By varying the electrical bias to this structure, further control over the flux and energy of charged species, i.e., electrons and ions, being imparted to the sample are achieved. When the plasma source is biased negative relative to these structures, a broad beam or stream of electrons will be extracted from the plasma toward the substrate. The energy of the electrons can be controlled by the magnitude of the dc bias on the ac source.

In a variation of this third embodiment, for etching conducting substrates, the sample is placed upon the anode of a dc plasma reactor as described in commonly assigned copending U.S. patent application Ser. No. 08-705,902, filed Aug. 28, 1996 and titled "METHOD AND APPARATUS FOR LOW ENERGY ELECTRON ENHANCED ETCHING OF SUBSTRATES," however as an improvement thereon, the additional structure as described above is placed within the plasma in close proximity to the sample, thus allowing improved precise control over the flux and energy of charged species being imparted to the sample.

The process for the present invention with respect to an ac plasma reactor is similar to that described with respect to a dc plasma reactor. Variations necessary because of physical differences between various reactor configurations will not be discussed in detail. The mechanical support and the additional structure are equally applicable to both ac and dc plasma reactors Furthermore, the benefits of the present invention are equally applicable to various ac plasma reactor configurations such as resonant microwave cavity reactors and inductively coupled plasma reactors.

In the second preferred embodiment as discussed above and with respect to an ac plasma reactor, an external electrical bias, with respect to the plasma potential, is applied to the mechanical support, and therefore, to the sample resting thereon. The external electrical bias applied to the mechanical support can be of a dc or an ac nature, or a combination of the two.

The present invention also includes an apparatus for performing anisotropic etching of a substrate. The etching of any substrate, whether conducting, non-conducting, or insulating can be accomplished using the concepts of the present invention.

The apparatus includes any chamber as is known by those skilled in the art for generating a plasma. The apparatus used to practice the present invention is similar whether used within a dc or an ac plasma. Within the plasma chamber is placed a mechanical structure for physically supporting the sample to be etched. It is important to note that in all but one possible configuration, in the case of a plasma reactor that uses electrical conductors such as an anode and a cathode to generate the plasma flow, the mechanical support is not used as an electrode to generate or maintain the plasma flow, but in a first preferred embodiment, merely as a mechanical support for the sample to be etched, and in subsequent embodiments, not as an electrode involved in the generation or maintenance of the plasma, but one which imparts an electrical bias to the sample resting thereon.

In a first preferred embodiment, i.e., one having no external voltage applied to the mechanical support, and thus the sample, the sample is held by the mechanical support in the plasma and allowed to achieve its floating potential.

In a second preferred embodiment, the mechanical support is capable of being electrically biased with respect to the plasma potential. This allows the mechanical support to impart the electrical bias to the sample resting thereon. The external electrical bias applied to the mechanical support can be of a dc or an ac nature, or a combination of the two.

In a third preferred embodiment, an additional structure, for example a grid, or a permeable cap, capable of imparting an electrical potential is placed within the plasma. This additional structure is one that is capable of being electrically biased in similar fashion to that of the mechanical support used to support the sample. This additional structure is typically placed within the plasma in close proximity to the sample to be etched. By varying the electrical bias to this structure, further control over the flux and energy of charged species, i.e., electrons and ions, being imparted to the sample are achieved.

In a variation of this third embodiment, and for etching conducting substrates, the sample is placed upon the anode of a dc plasma reactor as described in commonly assigned copending U.S. patent application Ser. No. 08/705,902, filed Aug. 28, 1996 and titled "METHOD AND APPARATUS FOR LOW ENERGY ELECTRON ENHANCED ETCHING OF SUBSTRATES," however as an improvement thereon, the additional structure as described above is placed within the plasma in close proximity to the sample, thus allowing improved precise control over the flux and energy of charged species being imparted to the sample.

An advantage of the present invention is that low damage sub-micron anisotropic etching of a conducting, semi-conducting, or insulating substrate is achieved.

Another advantage of the present invention is that it is applicable to a variety of substrates using a variety of reactive species.

Another advantage of the present invention is that it allows an improved degree of control over the flux and energy of charged species being imparted to a substrate.

Another advantage of the present invention is that by moving the sample off the anode, electric current no longer has to pass directly through the sample, thus avoiding any charging damage that may occur if the sample is located at an electrode.

Another advantage of the method and apparatus of the present invention is that the apparatus is fairly simple to assemble and operate.

Another advantage of the method and apparatus of the present invention is that the permeable wall hollow cathode can generate a higher flux of low energy electrons, at a lower pressure.

Other features and advantages of the method and apparatus of the present invention will become apparent to one with skill in the art upon examination of the drawings and the detailed description.

BRIEF DESCRIPTION OF THE DRAWINGS

The present invention can be better understood with reference to the following drawings. The drawings are not necessarily to scale, emphasis instead being placed upon clearly illustrating principles of the present invention.

FIG. 4 is a schematic view of an illustrative ac plasma reactor illustrating three preferred embodiments of the present invention;

FIG. 5 is a detail schematic view of a sample support apparatus of the present invention.

DETAILED DESCRIPTION OF THE PREFERRED EMBODIMENT

In the foregoing description of the preferred embodiments, the present invention is applicable equally both to a dc plasma reactor and an ac plasma reactor. Variations necessary because of physical differences between various reactor configurations are contemplated and will not be discussed in detail. Furthermore, the benefits of the present invention are equally applicable to various ac plasma reactor configurations, for example, resonant microwave cavity reactors and inductively coupled plasma reactors.

In all embodiments that use conductors to generate the low energy electrons desired to form the plasma flux, the cold cathode can be a hollow cathode formed with permeable, meshed, or perforated, generally referred to as permeable, walls rather than the typical solid walls. The cathode may be cylindrically shaped with a side wall of a permeable conductive material, such as stainless steel mesh, and having one end that is open or closed and an open end. The cathode is connected to a cathode mounting post and to the power supply. The cathode may comprise a plurality of nested side walls, each connected to the power supply. The use of this cathode allows the generation of a large flux of low energy electrons at low pressure and temperature. A cathode made in accordance with that described is described in copending commonly assigned U.S. patent application Ser. No. 08/899,341, filed Jul. 23, 1997, titled "APPARATUS AND METHOD FOR REDUCING OPERATING VOLTAGE IN GAS DISCHARGE DEVICES."

Figure 1:
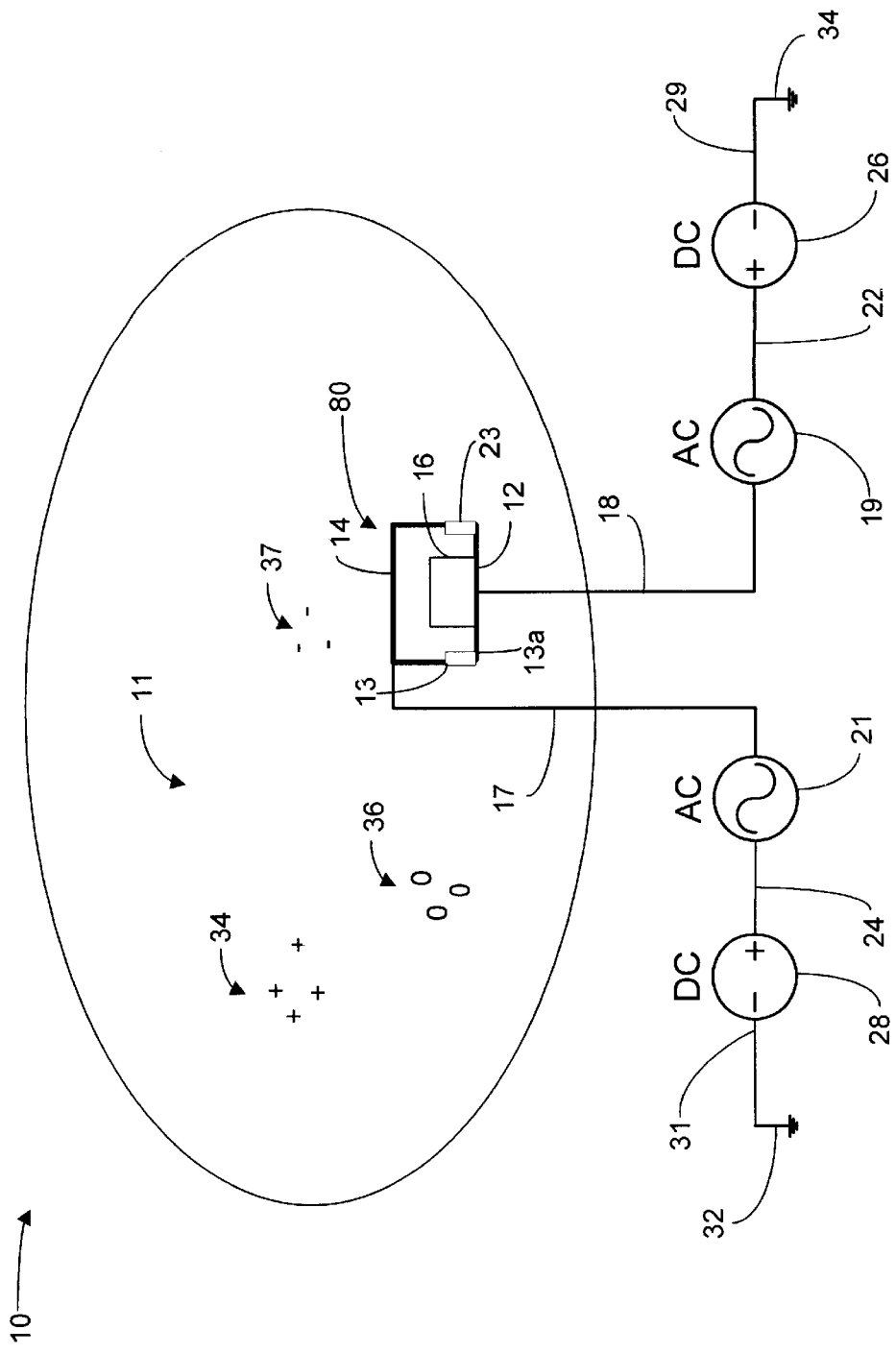
FIG. 1 is a schematic view of a plasma reactor apparatus employing the features of the present invention.

A preferred embodiment of an etching apparatus suitable for practicing the concepts of the present invention, referred to generally as 10, is illustrated in FIG. 1. The apparatus includes a plasma chamber 11 suitable for striking, maintaining, and containing a plasma as known by those skilled in the art. Within plasma chamber 11 reside various species of particles including positively charged ions 34, neutral species 36 and negatively charged electrons 37. The plasma generating apparatus itself includes various means for generating low energy electrons, maintaining a vacuum, introducing the charged and neutral species and monitoring and regulating the plasma process as is known in the art, and has been omitted from FIG. 1 for clarity.

DC plasma reactors are ones in which a dc power source is used to strike the plasma flow. AC plasma reactors are ones in which an ac power source is used to strike the plasma flow. AC plasma reactors can be for example, conventional in which electrodes (an anode and a cathode) are employed to generate the plasma flow, or electrodeless plasma generators such as a resonant microwave cavity or an inductively coupled plasma generator. These and other plasma generating sources known to those skilled in the art are capable of being employed to practice the concepts of the present invention, and indeed, the present invention can be used in conjunction with any dc or ac plasma reactor with similar benefit.

As shown in FIG. 1, apparatus 10 includes sample support apparatus 80 which includes, among other items, mechanical support 12 designed to support substrate sample 16 in a suitable location within plasma chamber 11. Sample 16 can be a conducting, semi-conducting, or an insulating substrate.

Electrically connected to mechanical support 12 through connection 18 is AC power source 19. Connected to AC power source 19 on connection 22 is DC power source 26 which in turn is connected on line 29 to ground 34.

In a first preferred embodiment of the present invention, mechanical support 12 is used to mechanically hold sample 16 in a suitable location within plasma chamber 11, with AC power source 19 and DC power source 26 inactive. In this embodiment, no external voltage is applied to mechanical support 12, and thus sample 16 achieves a "floating potential," which in the case of both a dc plasma and an ac plasma is negative relative to the "plasma potential" in the body of the plasma. In the absence of voltage applied to mechanical support 12, the difference between floating and plasma potential naturally attracts ions 34 from the plasma to sample 16. In the body of the plasma, the density of electrons and ions is on average equal. Therefore, in the absence of any external electric fields, or in the vicinity of a perturbation, the plasma is at an equipotential. This is usually called the plasma potential and is sometimes referred to as the space potential. An electrically isolated body, such as sample 16, placed in the plasma will initially be bombarded by electrons and ions. The current density of electrons is much larger than that of the ions and so very quickly the body will collect an excess of negative charge. This repels electrons and attracts ions. The electron flux is decreased so that it just balances the ion flux on the body. At this point the body has reached a steady state of excess charge, electric field and potential. The potential it has reached is called the floating potential, and since it repels electrons it is less than the plasma potential. In the instance of a dc plasma the floating and plasma potentials are negative with respect to the grounded anode. In the absence of a reference potential (e.g. when the plasma is created by ac inductive coupling), only the difference in the plasma and floating potential is meaningful.

Still referring to FIG. 1 and in a second preferred embodiment, an external electrical bias, with respect to the plasma potential, is applied to mechanical support 12, and therefore to sample 16. AC power source 19 and DC power source 26 are used either individually or collectively to impart either an AC, DC or a combination of AC and DC electrical bias to mechanical support 12. Application of increasingly positive external voltage to mechanical support 12 decreases the net current, which goes to zero when the external voltage exactly matches the floating potential. At this point, the current of positive ions 34 exactly matches and compensates the current of electrons 37. Increasing the positive external voltage to values greater than the floating potential causes the net current from plasma to mechanical support 12 to become progressively negative. At external voltages more positive than the plasma potential, mechanical support 12 rejects positive ions 34 and attracts electrons 37.

Most of these arriving electrons 37 will collide with sample 16, give up some of their kinetic energy to it, and be reflected back into the body of the plasma. Some of them will stick to the substrate surface, thereby transferring negative charge to it. If sample 16 is an insulator, it cannot drain off this surface charge, which could accumulate sufficiently to generate a negative potential capable of blocking the arrival of further electrons 37, thereby stopping the etching process. To prevent this, sample 16 must be periodically "discharged" or "neutralized" by reducing the external bias supplied through mechanical support 12 slightly below plasma potential. This will enable a sufficient number of positive ions 34 to arrive from the plasma to cancel the accumulated negative charge, while keeping their energy too small to inflict ion bombardment damage. Thus, the substrate sample 16 on mechanical support 12 must be subjected to a modulated positive voltage supplied on connection 18 to mechanical support 12. When this external bias is "high," LE4 occurs. When this external bias is "low," the negative charge on the substrate is being neutralized. The magnitude of the positive bias must be sufficient to reject positive ions 34 and also large enough to give electrons 37 sufficient energy to overcome the threshold for LE4. The frequency of bias pulse must be sufficient to prevent negative charge buildup (which would stop LE4) by discharging sample 16 often enough. The requisite magnitude and frequency, as well as the optimal waveform (e.g. square wave vs. sinusoidal) must be determined empirically for each combination of substrate and etching gas.

Still referring to FIG. 1 and in a third preferred embodiment, additional structure 14, which can be a grid, or permeable cap, capable of imparting an electrical potential is placed within plasma chamber 11. Additional structure 14 can be fabricated in a manner similar to that described with respect to the cold cathode discussed above. In one embodiment, additional structure can be a grid placed in close proximity to sample 16 and will be explained in further detail below with respect to sample support apparatus 80 illustrated in FIG. 5. In an additional embodiment, insulating non-permeable ring 23 is added to mechanical support 12 and surrounds sample 16. Ring 23 is joined to mechanical support 12 and additional structure 14 in such a way as to prevent electrons and ions from penetrating joints 13 and 13a. This arrangement ensures that any electrons or ions that reach sample 16 must pass through additional structure 14 and will be explained in further detail below with respect to sample support apparatus 80 illustrated in FIG. 5a. This additional structure 14 is one that is capable of being electrically biased in similar fashion to that of mechanical support 12 used to support sample 16. Additional structure 14 is typically placed within the plasma in close proximity to sample 16 to be etched. Additional structure 14 is connected on connection 17 to AC power source 21. AC power source 21 is connected on connection 24 to DC power source 28 which is connected on connection 31 to ground 32. By varying the electrical bias to additional structure 14, further control over the flux and energy of charged species, i.e., electrons 37 and ions 34, being imparted to sample 16 is achieved. Specifically, the extraction and retardation of electrons 37 and ions 34 from the plasma to sample 16 are controlled in order to further enhance the quality of the etching imparted to sample 16. Similar to the electrical bias capable of being applied to mechanical support 12 holding sample 16, the electrical bias applied to additional structure 14 by AC power source 21 and DC power source 28 can be of an ac or dc nature, or a combination of the two.

In this third preferred embodiment, electrically neutral reactive species 36 will form reactive beams or streams collinear with electrons 37. This combination of low energy electrons 37 and reactive species 36 arriving at the surface will accomplish LE4 of the substrate.

Most of these arriving electrons 37 will collide with sample 16, give up some of their kinetic energy to it, and be reflected away into the body of the plasma. Some of them will stick to the substrate surface, thereby transferring negative charge to it. If sample 16 is an insulator, it cannot drain off this surface charge, which could accumulate sufficiently to generate a negative potential capable of blocking the arrival of further electrons 37, thereby stopping the etching process. To prevent this, sample 16 must be periodically "discharged" or "neutralized" by applying a periodic ac external bias to it on connection 18 using AC power source 19. During the positive swing of this bias, electrons 37 will be attracted to sample 16, and LE4 will occur. During the negative swing, accumulated negative surface charge will be ejected, in effect neutralizing the substrate surface.

Applying a positive bias to a plasma source, relative to additional structure 14, in contact with the plasma, enables the extraction of a beam of electrons from the plasma. The present invention extracts a beam of electrons from the plasma. Alternatively, the electron extraction bias on the ac plasma source could be modulated, so that during its positive swing, positive ions (instead of electrons) would be extracted from the source and beamed to the substrate, effecting neutralization of the accumulated negative charge. Magnitude of the positive bias would be kept too low to give ions sufficient energy for ion bombardment damage at the substrate.

Figure 2:
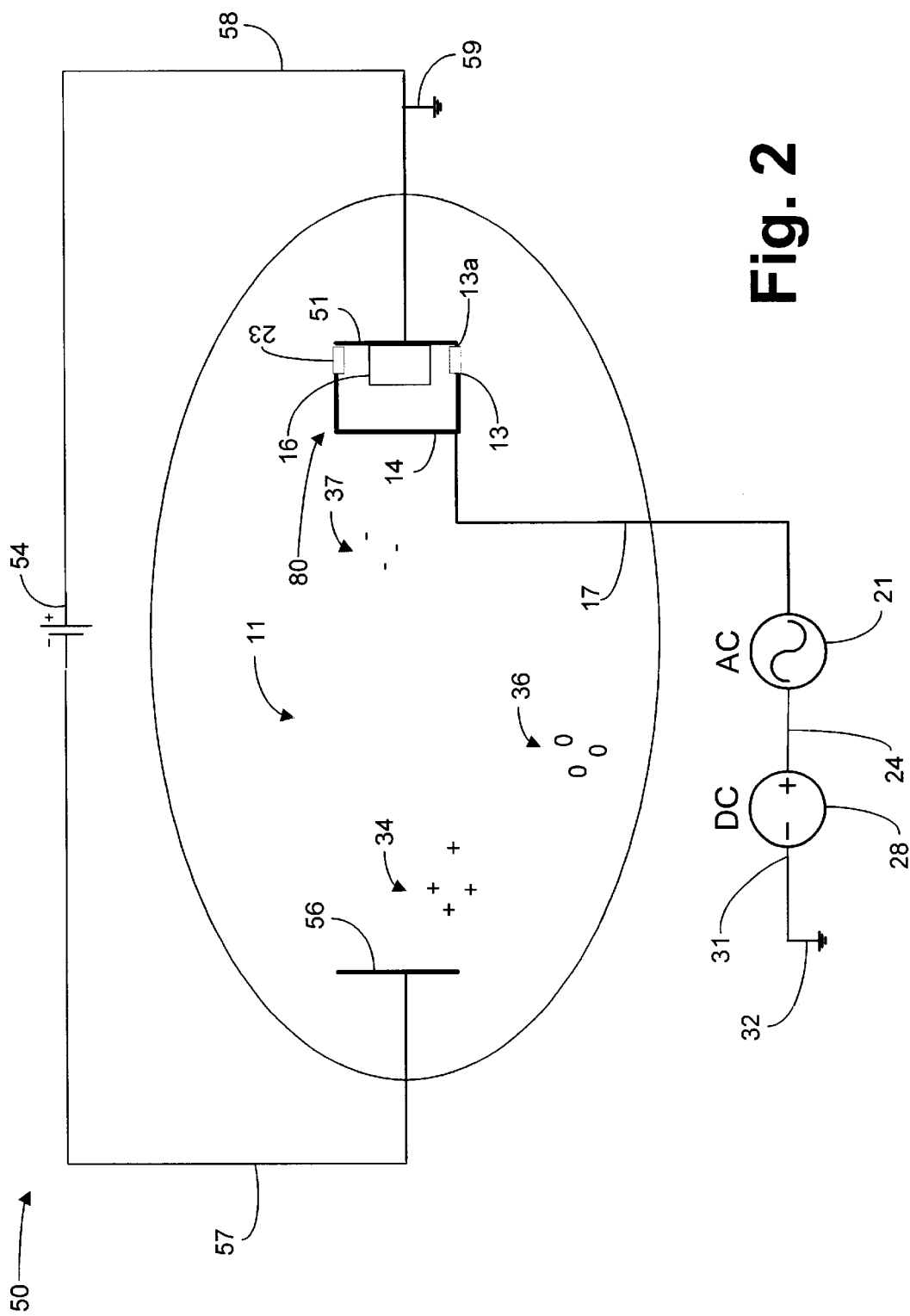
FIG. 2 is a schematic view of a dc plasma reactor illustrating an embodiment of the present invention.

Referring now to FIG. 2, in a variation of this third embodiment, and applicable in a dc plasma environment for etching conducting substrates, sample 16 is placed upon anode 51 of dc plasma reactor 50 in similar fashion to that described in commonly assigned copending U.S. patent application Ser. No. 08/705,902, filed Aug. 28, 1996 and titled "METHOD AND APPARATUS FOR LOW ENERGY ELECTRON ENHANCED ETCHING OF SUBSTRATES," however as an improvement thereon, additional structure 14 as described above is placed within plasma chamber 11 in close proximity to sample 16. By electrically biasing additional structure 14 using AC power source 21 and DC power source 28 as described above, improved precise control over the flux and energy of charged species being imparted to sample 16 is achieved. In addition to anode 51, dc plasma reactor 50 includes cathode 56 and dc power source 54. DC power source 54 is connected to cathode 56 on line 57 and to anode 51 on line 58. In addition anode 51 is attached to ground 59. The operation of the remaining components of FIG. 2 are similar to that as described with respect to FIG. 1.

Figure 3:
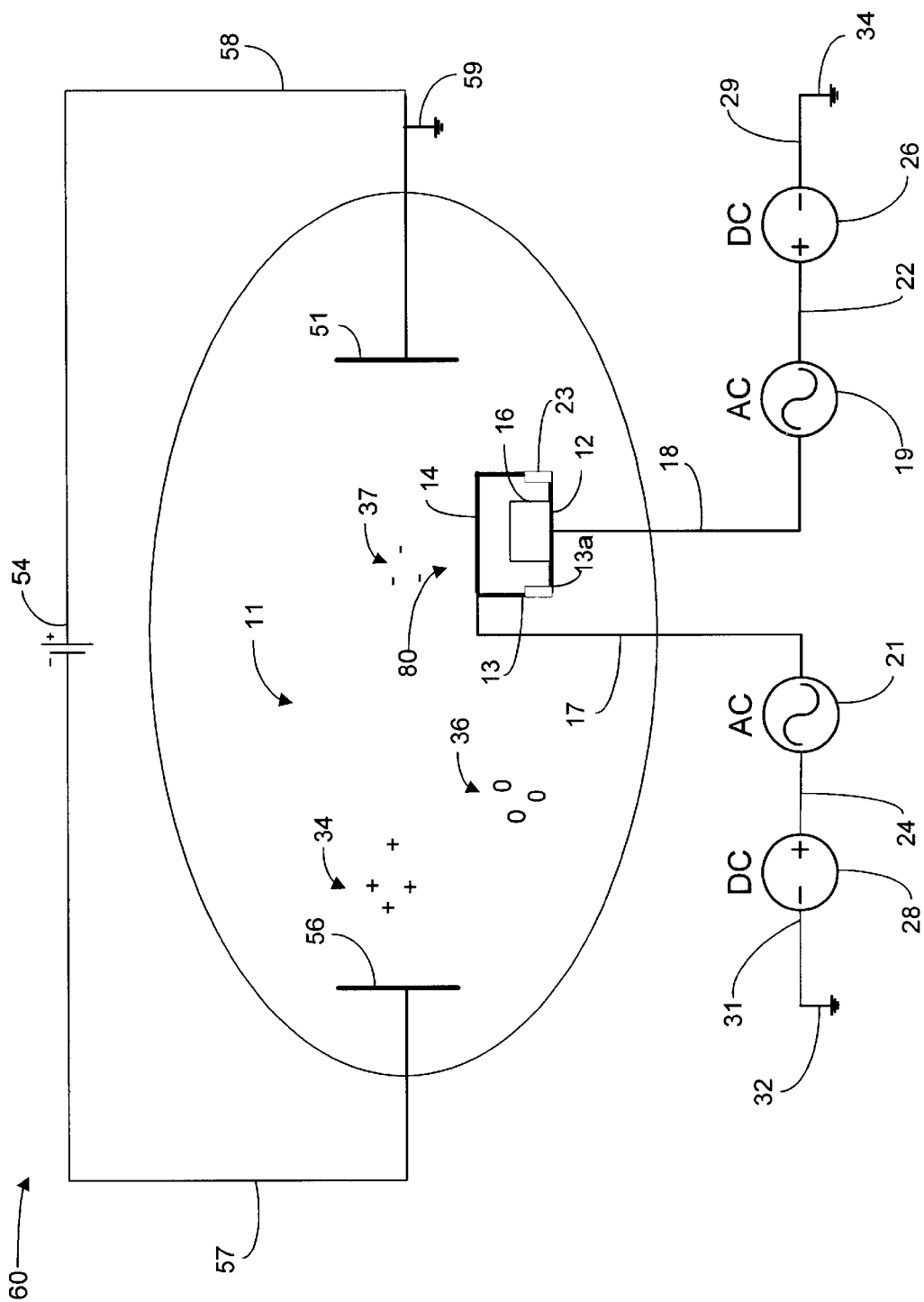
FIG. 3 is a schematic view of a dc plasma reactor illustrating three preferred embodiments of the present invention.

FIG. 3 is illustrative of the present invention in a dc plasma generating environment and illustrates a dc plasma reactor 60 employing the concepts of the present invention. DC power source 54 generates a dc plasma in plasma chamber 11 using cathode 56 and anode 51 as known by those skilled in the art and will not be explained in detail. The operation of the invention is the same as with respect to FIG. 1.

Cathode 56 is mounted in the plasma chamber 11. Cathode 56 is preferably a cold cathode, sometimes referred to as a field emission cathode, meaning it functions without the application of heat. The cathode is activated using external power source 54 that applies a direct current (DC) voltage between cathode 56 and anode 51. Because the chamber contains a gas, the chamber functions as a DC glow-discharge tube or DC plasma reactor. The cathode may be a standard cold cathode such as are known in the art or one constructed in accordance with the teaching of copending commonly assigned U.S. patent application Ser. No. 08/899,341, filed Jul. 23, 1997, titled "APPARATUS AND METHOD FOR REDUCING OPERATING VOLTAGE IN GAS DISCHARGE DEVICES."

FIG. 4 is a view illustrating an ac plasma reactor 70 employing the concepts of the present invention. AC plasma reactor 70 illustrates an inductively coupled plasma reactor and is merely one type of ac plasma reactor. The present invention is equally applicable to any ac plasma reactor, the ac reactor shown in FIG. 4 being used for illustrative purposes only. AC power source 71 supplies power to coil 72 through connections 74 and 76. AC power source 71 and coil 72 create an ac plasma within plasma chamber 11 as known by those skilled in the art and will not be explained in detail. The operation of the invention is the same as with respect to FIG. 1.

FIG. 5 is a detail schematic view of sample support apparatus 80, which includes the mechanical support 12 and additional structure 14 of the present invention. Additional structure 14, connected to AC and DC power sources on connection 17 and capable of imparting an electrical potential, is placed within plasma chamber 11 (omitted for clarity) in close proximity to sample 16. Additional structure 14 can be fabricated in a manner similar to that described with respect to the cold cathode discussed above and is permeable in order to promote the unimpeded passage of charged and neutral species.

Figure 5A:
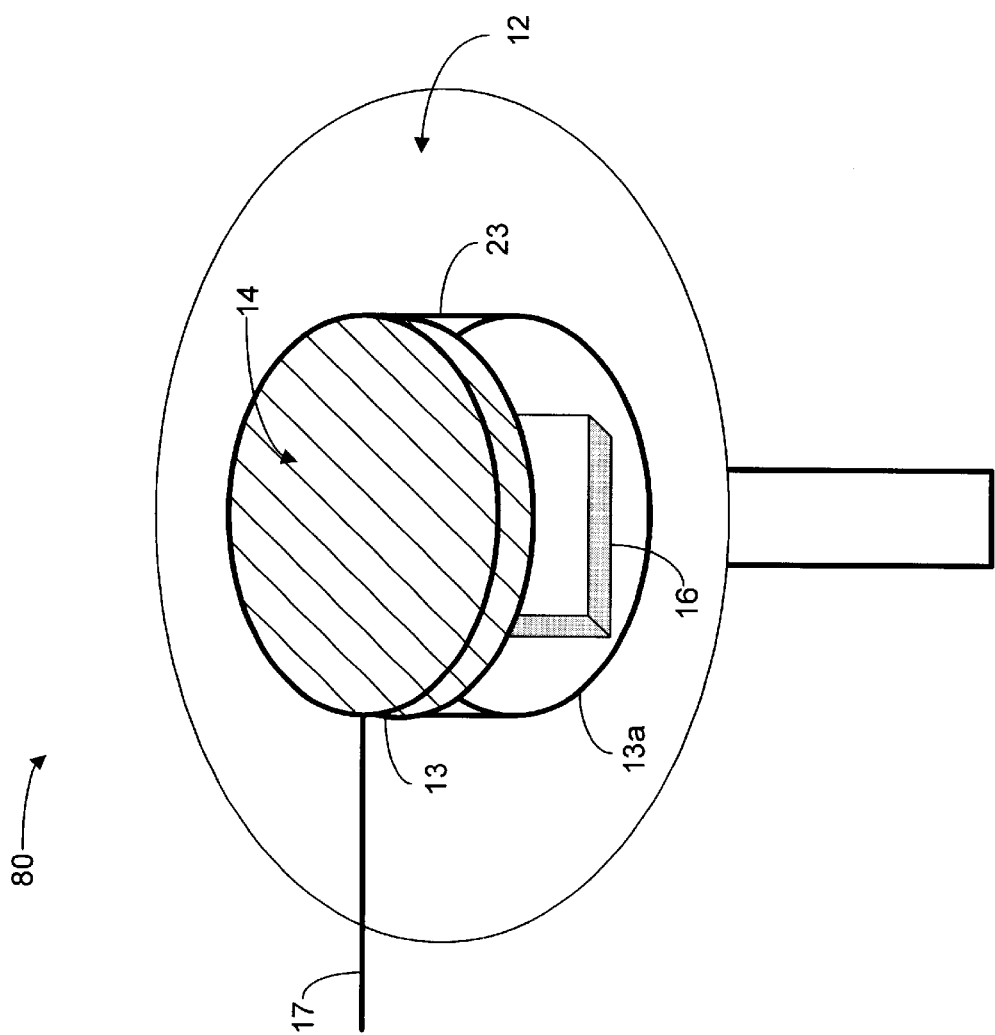
FIG. 5a is a detail schematic view of an alternate embodiment of the sample support apparatus of FIG. 5.

FIG. 5a is a detail schematic view of sample support apparatus 80, which includes the mechanical support 12 and additional structure 14 of the present invention. Additional structure 14, connected to AC and DC power sources on connection 17 and capable of imparting an electrical potential, is placed within plasma chamber 11 (omitted for clarity). Additional structure 14 can be fabricated in a manner similar to that described with respect to the cold cathode discussed above and is permeable in order to promote the unimpeded passage of charged and neutral species. In this embodiment, insulating non-permeable ring 23 is placed upon mechanical support 12 in such a way as to surround sample 16. Ring 23 is joined to mechanical support 12 and additional structure 14 in such a way as to prevent electrons and ions from penetrating joints 13 and 13a. This arrangement ensures that any electrons or ions that reach sample 16 must pass through additional structure 14.

It will be obvious to those skilled in the art that many modifications may be made to the preferred embodiments of the present invention, as set forth above, without departing substantially from the principles of the present invention. All such modifications are intended to be included herein within the scope of the present invention, as defined in the following claims.

The following is claimed:

1. A process for low-damage anisotropic dry etching of a substrate, comprising the steps of:

placing a substrate on a mechanical support within a plasma reactor, said mechanical support isolated from the creation of the plasma, said plasma including low energy electrons having a kinetic energy less than about 100 eV and at least one species reactive with the substrate; and directing said low energy electrons and said reactive species onto the substrate.

2. The process of claim 1, further comprising the step of selecting said substrate from the group consisting of Group III–V semiconductors, Group IV semiconductors, Group II–VI semiconductors, metals, alloys of the foregoing, superconductors, polymers, and insulating substrates.

3. The process of claim 1, wherein said plasma reactor generates a dc plasma.

4. The process of claim 1, wherein said plasma reactor generates an ac plasma.

5. The process of claim 1, wherein said mechanical support is electrically biased, said mechanical support imparting said electrical bias upon the substrate.

6. The process of claim 5, wherein said mechanical support imparts a dc electrical bias upon the substrate.

7. The process of claim 5, wherein said mechanical support imparts an ac bias upon the substrate.

8. The process of claim 5, wherein said mechanical support imparts both a dc and an ac bias upon the substrate.

9. The process of claim 5, further comprising the step of periodically modulating said electrical bias of said mechanical support to a value below the value of the electrical potential of the plasma.

10. The process of claim 1, further comprising the step of including an additional structure within said plasma, said additional structure capable of being electrically biased.

11. The process of claim 10, wherein said additional structure is dc electrically biased.

12. The process of claim 10, wherein said additional structure is ac electrically biased.

13. The process of claim 10, wherein said additional structure is both ac and dc electrically biased.

14. A process for low-damage anisotropic dry etching of a substrate, comprising the steps of:

providing a direct current plasma reactor including a cathode and an anode;

placing a semiconductor on the anode of the direct current plasma reactor;

generating low energy electrons with a cold cathode;

subjecting the semiconductor to a plasma including low energy electrons and a species reactive with the semiconductor; and placing an additional structure within said plasma, said additional structure capable of being electrically biased.

15. The process of claim 14, further comprising the step of selecting said substrate from the group consisting of Group III–V semiconductors, Group IV semiconductors, and Group II–VI semiconductors.

16. The process of claim 14, wherein said additional structure is dc electrically biased.

17. The process of claim 14, wherein said additional structure is ac electrically biased.

18. The process of claim 14, wherein said additional structure is both ac and dc electrically biased.

* * * * *